United States Patent [19]

Goldstein

[11] Patent Number: 5,491,114

[45] Date of Patent: Feb. 13, 1996

[54] METHOD OF MAKING LARGE-AREA SEMICONDUCTOR THIN FILMS FORMED AT LOW TEMPERATURE USING NANOCRYSTAL PRESURSORS

[75] Inventor: Avery N. Goldstein, Midland, Mich.

[73] Assignee: Starfire Electronic Development & Marketing, Ltd., Bloomfield Hills, Mich.

[21] Appl. No.: 217,162

[22] Filed: Mar. 24, 1994

[51] Int. Cl.$^6$ ................................ H01L 21/20
[52] U.S. Cl. ............... 437/233; 437/89; 437/90; 437/126; 437/132
[58] Field of Search ............... 437/89, 90, 126, 437/132, 133, 138, 233

[56] References Cited

U.S. PATENT DOCUMENTS

| | | | |
|---|---|---|---|
| 4,876,218 | 10/1989 | Pessa et al. | 437/132 |
| 4,910,167 | 3/1990 | Lee et al. | 437/132 |
| 5,141,893 | 8/1992 | Ito et al. | 437/132 |
| 5,262,357 | 11/1993 | Alivisatos et al. | 437/233 |

OTHER PUBLICATIONS

J. R. Heath, S. M. Gates, C. A. Chess, "Nanocrystal seeding: A low temperature route to polycrystalline Si films", Appl. Phys. Lett. 64(26), 27 Jun. 1994, pp. 3569–3571.
G. Samdani, S. Moore, G. Parkinson, "Tiny Particles Aim for Big Markets", Chemical Eng./Aug. 94 pp. 35–39.
*Science*; Goldstein, A., Echer, C., Alivisatos, A., Jun. 1992, vol. 256, pp. 1425–1427, "Melting in Semiconductor Nanocrystals".
*Physical Review A;* Buffat, Ph., Borel, J. P., vol. 13, No. 6, Jun. 1976 "Size effect on the melting temperature of gold particles".
*Physical Review Letters;* Erolessi, F., Andreoni, W., Tosatti, F., vol. 66, No. 7, Feb. 91 "Melting of Small Gold Particles".
*J. Phys. D: Appl Phys;* Wautelet, M., vol. 24, pp. 343–346 (1991) "Estimation of the variation of the melting temperature with the size of small particles . . . ".
*Physical Review A;* Berry, R., Jellinek, J., Natanson, G., vol. 30, No. 2, "Melting of clusters and melting".

Primary Examiner—R. Bruce Breneman
Assistant Examiner—Ramamohan Rao Paladugu
Attorney, Agent, or Firm—Gifford, Krass

[57] ABSTRACT

A continuous semiconductor thin film is formed by providing a sheet of a substrate material and applying a continuous layer of nanocrystals of the semiconductor material onto the substrate. The layer of nanocrystals is melted at a temperature below that of the bulk, but which is nonetheless adequate to melt the nanocrystals and cause them to fuse into a continuous thin film which forms a solid upon cooling. The nanocrystals may be sprayed onto the substrate, either from the liquid or gas phase. The substrate sheet is preferably tensioned during the application of the nanocrystalline layer, for example, with a set of rollers is used to provide the tensioning at a predetermined feed rate.

19 Claims, 1 Drawing Sheet

METHOD OF MAKING LARGE-AREA SEMICONDUCTOR THIN FILMS FORMED AT LOW TEMPERATURE USING NANOCRYSTAL PRESURSORS

FIELD OF THE INVENTION

The invention relates to the formation of inorganic semiconductor thin films under moderate thermal conditions, and, in particular, to the formation of a continuous thin film onto a sheet of a substrate material.

BACKGROUND OF THE INVENTION

The reduction of the melting point in nanometersized metal and molecular clusters has been the subject of numerous theoretical studies and simulations (Ph. Buffat and J.-P. Borel, *Phys. Rev. A* (1976)13:2287; M. Wautelet, *J. Phys. D* (1991)24:343; F. Ercolessi, W. Andreoni and E. Tossati, *Phys. Rev. Let.* (1991) 66:911; R. S. Berry, J. Jellinek and G. Natanson, *Phys. Rev. A* (1984)30:919). In the semiconductor area, reduced melting temperatures have been demonstrated for binary systems (A. N. Goldstein, C. M. Echer and A. P. Alivisatos, *Science* (1992)256:1425), albeit with a material dependent tendency towards disproportionation prior to melting, such as in the case of GaAs (A. N. Goldstein, Ph. D. dissertation, University of California at Berkeley (1993)).

In a concurrently field co-pending U.S. application I disclosed that such techniques may be extended to the Group IV semiconductors germanium and silicon, despite the fact that in such open systems bonding is predominantly covalent.

SUMMARY OF THE INVENTION

According to the invention a continuous thin film of a semiconductor material is formed by providing a sheet or wafer of a substrate material and applying a continuous layer of nanocrystals of the semiconductor material onto the substrate. The layer of nanocrystals is melted at a temperature below that of the bulk, but which is nonetheless adequate to melt the nanocrystals and cause them to fuse into a continuous thin film which forms a solid upon cooling. A less rigorous heating cycle which is sufficient only to cause a minimal sintering yields a porous thin film that retains the electronic properties of the individual nanocrystals.

The nanocrystals may be sprayed onto the substrate, either from the liquid or gas phase. The spray application of liquid phase nanocrystals in concert with a soluble polymer yields tapes which can subsequently be laminated or scribed prior to heating. A substrate sheet is preferably tensioned during the application of the nanocrystalline layer, for example, a set of rollers is used to provide the tensioning at a predetermined feed rate. Applications include the thin-film formation of conductors and semiconductors in microelectronics fabrication, solar conversion technologies and the like. The lower processing temperatures make it possible to form thin films with less stringent thermal requirements on the underlayers, substrates and other related structures.

BRIEF DESCRIPTION OF THE DRAWING

This invention will be described in greater detail with reference to the FIG. 1, which depicts in schematic form a continuous process method for producing sheets of thin film semiconductor films.

DETAILED DESCRIPTION OF THE PREFERRED EMBODIMENTS

Figure 1:
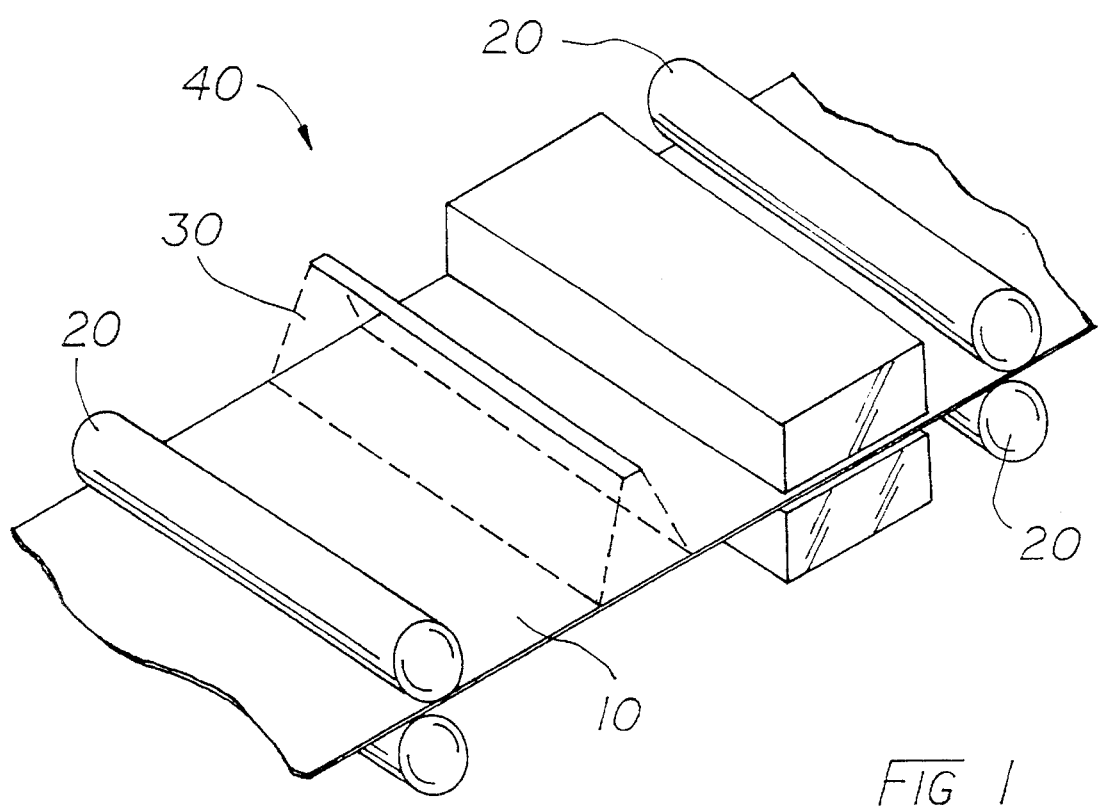

This invention provides a method for forming continuous semiconductor thin films, including compound and covalently bonded Group IV semiconductors and doped versions of these films. The specified semiconductors are provided in the form of nanocrystals, a nanocrystal being defined as a crystal having nanometer scale dimensions form 1 to 100 nm. The reduction in melting and annealing temperature is evident throughout the nanocrystal size regime, but the most pronounced effects and therefore, in their preferred embodiment these materials range in size from 1 to 6 nm. The particles may be produced by a variety of techniques including, but not exclusively evaporation, laser ablation, electrolysis, photolysis, thermolysis, microwave discharge, chemical etching, liquid phase and arrested precipitation methods. In my co-pending U.S. patent application referenced earlier, incorporated herein by reference, I disclose specific techniques relating to the synthesis of Group IV nanocrystals. In U.S. Pat. No. 5,262,357, of which I am a joint inventors this also incorporated herein by reference, several techniques associated with the synthesis of binary nanocrystals are described. These methods are only representative, however, and other methods also provide nanocrystals of these materials.

In accord with this invention, semiconductor thin films are formed by depositing a continuous layer of nanocrystals of the semiconducting compound on a substrate and fusing the nanocrystals at a temperature below the bulk melting point of the semiconducting compound. A continuous layer of nanocrystals is one in which enough particles are present to form a layer of particles touching one another. If the particles are not touching they will not flow together when melted. Thicker layers of up to three or four particles deep can be employed, however, vastly thicker layers such as 20 or 30 particles deep begins to act as if they are bulk materials and do not properly fuse at the low temperatures employed.

The fusing together of the nanocrystals takes place below the bulk melting temperature and in the most extreme sizes as much as 1000 K. below the bulk melting temperature of the semiconductor compound. Typically, this heating is carried out under vacuum and is completed within 15 seconds to 30 minutes. The products of this process are continuous thin films of semiconducting materials corresponding in stoichiometry to the nanocrystals from which they are formed. These films are from 2.5 to 20 nm in thickness.

These films can be formed on any suitable surface or substrate, for example on carbon, silicon, selenium dioxide, or other oxides such as alumina, boria, titania; on metals such as gold, copper, silver, aluminum, or the like; on high temperature thermally stable polymers such as aramids, carbonates, esters and the like. In the case of producing semiconductor thin films on metal oxide or silicon substrates which are too brittle to readily utilize in a form other than wafers, nanocrystals are either sprayed batch-wise to each discrete substrate or polymeric tape(s) containing nanocrystals are spread over the substrate. This last family of substrates is important as the process of the invention with its low operating temperatures allows for such deposit of semiconductors which could not be achieved practically with current processes.

The present invention is more particularly directed toward a continuous feed process to yield semiconductor thin films on a substrate. The preparation of thin films via a continuous feed process is illustrated in the figure. The process involves three basic steps. Initially, the substrate material 10 is drawn taut through a series of rollers 20 in order to establish proper tension and feed rate. The feed rate for a sheet substrate is dictated by both the cross sectional dimensions of the sheet and the flexural modulus of the material. Therefore, the throughput of a flaccid substrate such as gold foil, 1 cm wide and approximately 100 μm thickness cannot much exceed one linear cm/sec; whereas aluminum foils may be drawn at rates hundreds of times faster. The substrate then accepts a controlled application of nanocrystals 30, which may be either in a gas phase, a colloidal dispersion or a polymeric tape that was prepared from the aforementioned nanocrystal sources and peeled from its original substrate. The nanocrystal coated substrate is then heated in environment 40 in order to fuse the nanocrystals. This process step is carried out in an inert atmosphere or vacuum, as dictated by the semiconductor thermodynamic phase diagram.

The environment for spray application of nanocrystals is dictated by the media; solution-phase dispersions may be applied in a clean, ambient atmosphere, using an atomizer nozzle. It is necessary to remove excess solvent prior to heating in order to avoid inhomogenities in the final film. The time requirements of drying are considerable for low volatility solvent, but in any case are accelerated by the use of concentrated solutions, fine mists and counter currents of dry gases, such as nitrogen. Whereas a suitable environment is necessary for gas phase deposition of nanocrystals. While use of a cluster beam requires an elaborate set of baffles and rough pumping stages to maintain a sufficient vacuum between the beam source and the substrate sheet, relatively modest controls are needed using nanocrystals generated by photolysis or thermolysis of nanocrystal precursors molecules in the gas phase. A method of this type is described by K. A. Littan et al in J.Chem. Phys. (1993) 97:1224 and incorporated herein by reference. While gas phase condensation of nanocrystals onto the substrate is efficient, it may be wasteful of materials and susceptible to density variations across the substrate. Alternatively, the use of a colloidal solution allows for the recycling of nanocrystal material and uniform dispersions of particles, since colloidal nanocrystals have a surface passivating layer to prevent agglomeration in solution. The chemistry of the surface functionality is exploited to recover those nanocrystals which do not adhere to underlying substrate. Colloidal particles may be applied to the substrate either by immersion in a colloidal solution that wets the substrate or by evaporating the solution onto the coated substrate which yields a agglomerated nanocrystals as the solvent droplet disappears.

The products of this invention have semiconducting properties and can be used in semiconductor applications. This detailed description above has been set forth to illustrate the invention, but not to limit its scope, which is defined by the claims which follow:

I claim:

1. The method of forming a continuous thin film of a semiconductor material onto a substrate, comprising the steps of:

providing a sheet of a substrate material;

tensioning the sheet;

applying a continuous layer of nanocrystals of the semiconductor material;

heating the layer of nanocrystals at a temperature below that of the bulk melting temperature, but which is nonetheless adequate to melt the nanocrystals and cause them to fuse into a continuous thin film; and cooling the thin film to form a solid.

2. The process of claim 1 wherein the nanocrystals have an average diameter of from 1 to 6 nm.

3. The method of claim 1 wherein the step of cooling the liquid thin film to form a solid thin film includes forming a thin film in the range of 2.5 to 25 nm.

4. The method of claim 1, wherein at least one set of rollers is used to provide the tensioning at a predetermined feed rate.

5. The method of claim 1, wherein the step of applying the continuous layer of nanocrystals includes spraying a solution containing the nanocrystals.

6. The method of claim 1, wherein the step of heating the layer of nanocrystals is carried out in a non-oxidizing atmosphere.

7. The process of claim 1, the semiconductor material being a compound semiconductor.

8. The process of claim 1, wherein the semiconductor material is silicon.

9. The process of claim 1 wherein the semiconductor material is germanium.

10. The method of claim 1, wherein the substrate material is an insulator.

11. The method of claim 1, wherein the substrate material is a metal.

12. The method of claim 1, wherein the substrate material is a polymer.

13. The method of claim 1, wherein the step of applying the continuous layer of nanocrystals includes application of the nanocrystals in powder form.

14. The method of claim 1, wherein the step of applying the continuous layer of nanocrystals includes a gas-phase application.

15. The method of claim 1, wherein the step of applying the continuous layer of nanocrystals includes transferring a layer of nanocrystals in a polymeric tape form.

16. The method of forming a continuous thin film of a semiconductor material onto a substrate, comprising the steps of:

providing a sheet of a substrate material;

applying a continuous layer of nanocrystals of the semiconductor material by depositing the nanocrystals from the gas phase;

heating the layer of nanocrystals at a temperature below that of the bulk melting temperature, but which is nonetheless adequate to melt the nanocrystals and cause them to fuse into a continuous thin film; and cooling the thin film to form a solid.

17. The method of forming a continuous thin film of a semiconductor material onto a substrate, comprising the steps of:

providing a sheet of a substrate material;

applying a continuous layer of nanocrystals of the semiconductor material in powder form;

heating the layer of nanocrystals at a temperature below that of the bulk melting temperature, but which is nonetheless adequate to melt the nanocrystals and cause them to fuse into a continuous thin film; and cooling the thin film to form a solid.

18. The method of forming a continuous thin film of a semiconductor material onto a substrate, comprising the steps of:

providing a sheet of a substrate material;

preparing a layer of nanocrystals of the semiconductor material in the form of a polymeric tape;

transferring the tape layer to an area of the substrate;

heating the layer of nanocrystals at a temperature below that of the bulk melting temperature, but which is nonetheless adequate to melt the nanocrystals and cause them to fuse into a continuous thin film; and cooling the thin film to form a solid.

19. The method of claim 18, wherein the step of preparing a layer of nanocrystals of semiconductor material in polymeric-tape form includes the steps of:

mixing the nanocrystals with a suitable soluble polymer;

spreading the mixture on a flat surface;

driving off the polymeric component, leaving only a controlled layer of nanocrystals; and transferring the layer of nanocrystals to the substrate for final deposition thereon.

\* \* \* \* \*